United States Patent [19]

Yamaguchi

[11] Patent Number: 5,462,837
[45] Date of Patent: Oct. 31, 1995

[54] METHOD OF FABRICATING HIGH DENSITY PRINTED CIRCUIT BOARD

[75] Inventor: Masahiro Yamaguchi, Tokyo, Japan

[73] Assignee: NEC Corporation, Tokyo, Japan

[21] Appl. No.: 299,406

[22] Filed: Sep. 1, 1994

[30] Foreign Application Priority Data

Sep. 3, 1993 [JP] Japan ................... 5-219365

[51] Int. Cl.⁶ ......................................... G03F 7/20
[52] U.S. Cl. .................. 430/311; 430/396; 250/492.1
[58] Field of Search ........................ 430/311, 396; 250/492.1

[56] References Cited

U.S. PATENT DOCUMENTS 5,246,813  9/1993  Hoshinouchi ................ 430/311

FOREIGN PATENT DOCUMENTS 3-21011  1/1991  Japan ........................ 430/311
4-97588  3/1992  Japan .
4-93950  3/1992  Japan ........................ 430/311

*Primary Examiner*—Kathleen Duda
*Attorney, Agent, or Firm*—Sughrue, Mion, Zinn, Macpeak & Seas

[57] ABSTRACT

A method of fabricating a printed circuit board includes the steps of forming a circuit pattern, applying solder resist, and exposing the solder resist. The circuit pattern including pads is formed on a substrate. The solder resist is applied on the substrate and the circuit pattern. The solder resist between the pads is exposed using a light source which emits scattered light and a mask film which is equipped with light transmission portions. The width of each light transmission portion is narrower than the distance between the pads. This method enables the formation of the solder resist in between fine pads in such a way that it does not cover an upper surface of the pad. The solder resist thus formed between the fine pads provides sufficient adhesion to the substrate.

10 Claims, 5 Drawing Sheets

METHOD OF FABRICATING HIGH DENSITY PRINTED CIRCUIT BOARD

BACKGROUND OF THE INVENTION (1) Field of the Invention

The present invention relates to a method of fabricating printed circuit boards, and more particularly to a method of fabricating high density printed circuit boards having fine pads.

(2) Description of the Related Art

Generally, in order to prevent occurrence of solder bridging during the element mounting operation, a printed circuit board is provided with solder resists each formed between element mounting pads (hereinafter simply referred to as "pads"). As a method of forming a solder resist between the pads, a photolithography method is generally used. With this photolithography method, as shown in FIG. 1A, a predetermined circuit (not shown) and pads 2 are formed on a substrate 1. Then, as shown in FIG. 1B, a solder resist 3 of an optical hardening type is applied using such methods as screen printing, curtain coating, roll coating and spraying method. Next, as shown in FIG. 1C, a mask film 4 which allows transmission of light only at predetermined portions 5 is placed on the applied solder resist 3, which is followed by the exposure process. Thus, as shown in FIG. 1D, after the development and hardening, the solder resist 3 is formed between the pads 2.

For the exposure step in the conventional photolithography process, a light source which emits parallel light beams is generally used. However, as disclosed in Japanese Patent Application Kokai Publication No. Hei 4-97588, as a conventional solder resist formation method, a solder resist only in a via hole is exposed to scattering light during the exposure process and the solder resist is formed on an inner wall of the via hole in order to prevent the solder from sticking to an unintended portion during the element mounting operation.

However, in recent years, the miniaturization of mounting electronic elements has greatly advanced with the lead pitches being narrowed down as a consequence thereof. The demand brought about by this is that pads on printed circuit boards must be made smaller and finer. When the pads are made finer, the distance between the pads naturally is made narrower. For forming a solder resist between such fine pads by using a conventional technique, the only conceivable method is either (1) to narrow down the line width of the solder resist, or (2) to reduce the distance between the pad and the resist.

In order to ensure good adhesion between the solder resist and the substrate, the line width of the solder resist is required to be not less than 0.07 mm. If the adhesion between the solder resist and the substrate is in a poor state, the solder resist may peel off during the element mounting operation resulting in defective mounting.

When the expansion and contraction of the materials used, the expansion and contraction of the mask film, and the required precision in the alignment are taken into account, the distance between the pad and the solder resist is required to be not less than 0.06 mm.

One may attempt, by using the conventional technique, to form a solder resist between pads having a pitch of 0.3 mm (pad width being 0.15 mm and a distance between adjacent pads being 0.15 mm). In this case, if the priority is placed on the provision of a 0.06 mm distance between the solder resist and the pad, the width of the solder resist will become 0.03 mm so that the necessary adhesion cannot be attained. On the other hand, if the priority is placed on the attaining of a solder resist width of 0.07 mm, the distance between the pad and the solder resist becomes 0.04 mm, which leads to manufacturing fluctuations and, as shown in FIG. 2, results in a state wherein the solder resist 3 covers a portion of the pad 2.

Thus, with the conventional technique as explained above, it has not been possible to form a solder resist in between fine pads whose pitches are not larger than 0.3 mm.

SUMMARY OF THE INVENTION

An object of the invention, therefore, is to overcome the problems existing in the prior art and to provide a method of fabricating a printed circuit board which enables the formation of a solder resist in between fine pads even when the pitches thereof are not larger than 0.3 mm.

According to one aspect of the invention, there is provided a method of fabricating a printed circuit board, comprising the steps of:

forming on a substrate a circuit pattern including pads;
  applying a solder resist on the substrate and the circuit pattern; and
  exposing the solder resist between the pads using a light source which emits scattered light and a mask film which has light transmission portions.

According to the invention, during the exposure process of a solder resist, the exposure is carried out by using the mask film which has a light transmission portion whose width is narrower than the distance between the pads and the light source which emits scattered light. This enables the formation, between fine pads whose pitches are not larger than 0.3 mm, of the solder resist which does not touch or cover the pads and which provides good adhesion to the substrate.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention are explained with reference to the drawings. Throughout the following explanation, similar reference symbols or numerals refer to the same or similar elements in all the figures of the drawings.

Figure 1A:
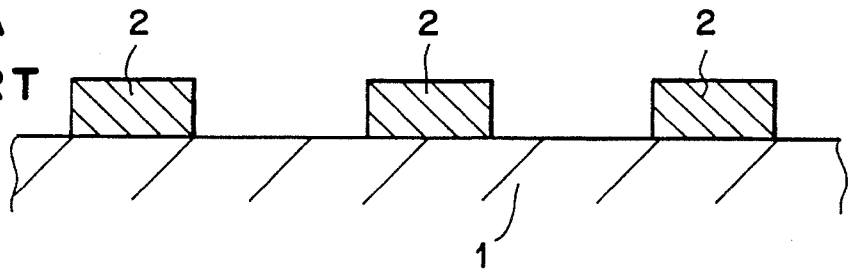
FIGS. 1A–1D are sectional views of a structure for explaining sequential process steps of a conventional method of fabricating a printed circuit board.
Figure 1B:
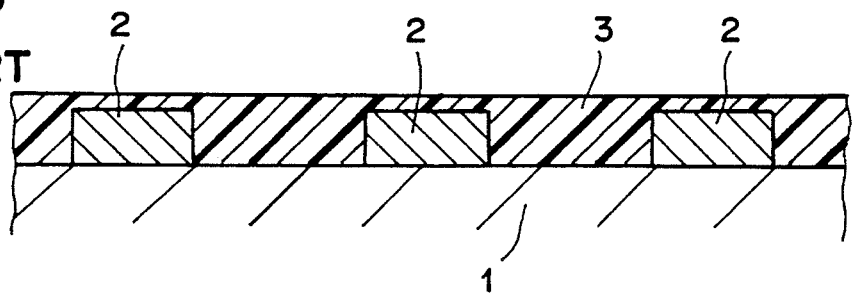
Figure 1C:
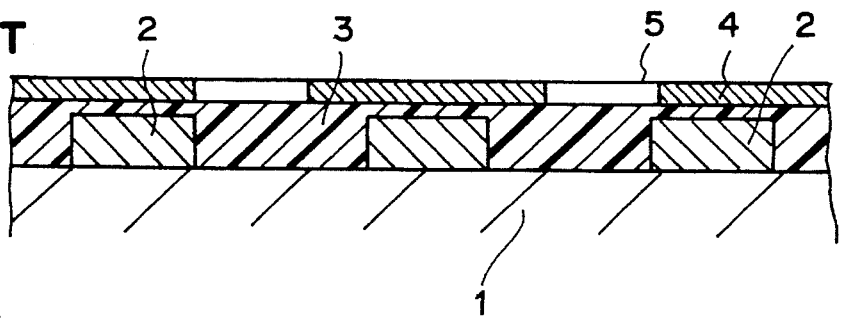
Figure 1D:
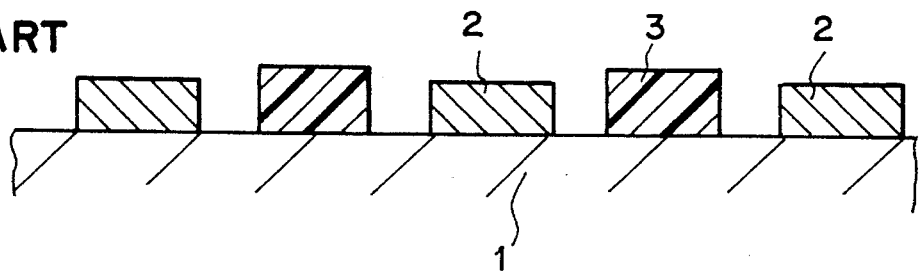
Figure 2:
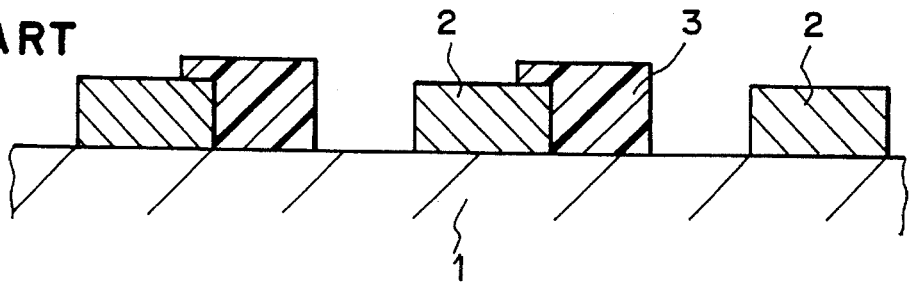
FIG. 2 is a sectional view of a part of the structure showing an undesirable state in which a solder resist covers a portion of a pad and which develops in the conventional method of fabricating a printed circuit board.
Figure 3A:
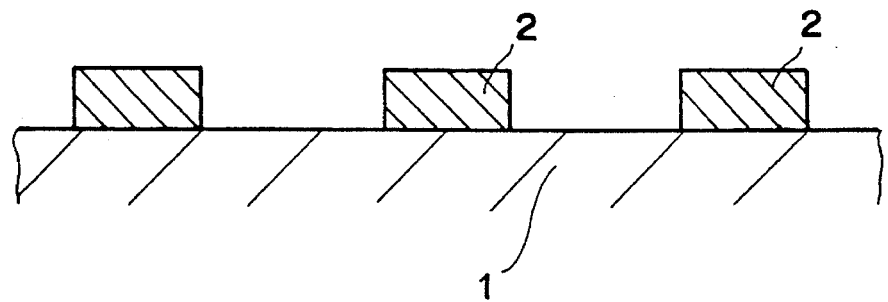
FIGS. 3A–3D are sectional views of a structure for explaining sequential process steps of a method of fabricating a printed circuit board of a first embodiment according to the invention.
Figure 3B:
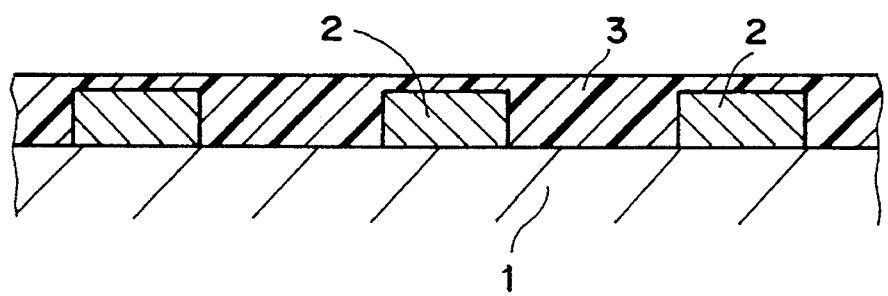
Figure 3C:
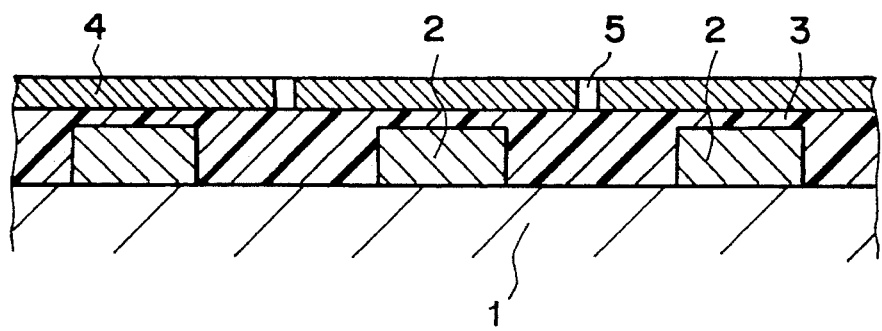
Figure 3D:
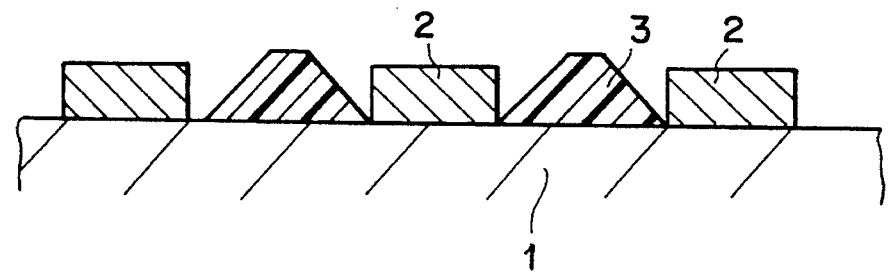

FIGS. 3A to 3D show a structure in sectional views for explaining sequential process steps of a method of a first embodiment according to the invention. First, as shown in FIG. 3A, a predetermined printed circuit (not shown) and pads 2 are formed on a substrate 1. Then, as shown in FIG. 3B, a solder resist 3 of an optical hardening type is applied on the substrate 1 and the pads 2 by using methods such as screen printing, curtain coating, roll coating and a spraying method. Next, as shown in FIG. 3C, a mask film 4 whose width of a light transmission portion 5 is narrower than the distance between the pads 2 is placed on the solder resist 3 such that the light transmission portion 5 is positioned at a middle point between the pads 2 and then the exposure process is carried out on the optical hardening type solder resist 3 by using an exposure device having a light source which emits scattering light beams. For the scattered light to be efficiently used, it is preferable that the exposure device be configured such that the object to be exposed is stationary with the light source being adapted to scanning, or that the light source is stationary with the object being adapted to be scanned. Next, as shown in FIG. 3D, the developing is carried out whereby a trapezoid solder resist 3 is formed between the pads 2. The size of the light transmission portion 5 in the mask film 4 is determined by or dependent on the design values of the pads and the distance between the pads 2, the thickness of the solder resist 3 and the kind of light source employed.

Figure 4A:
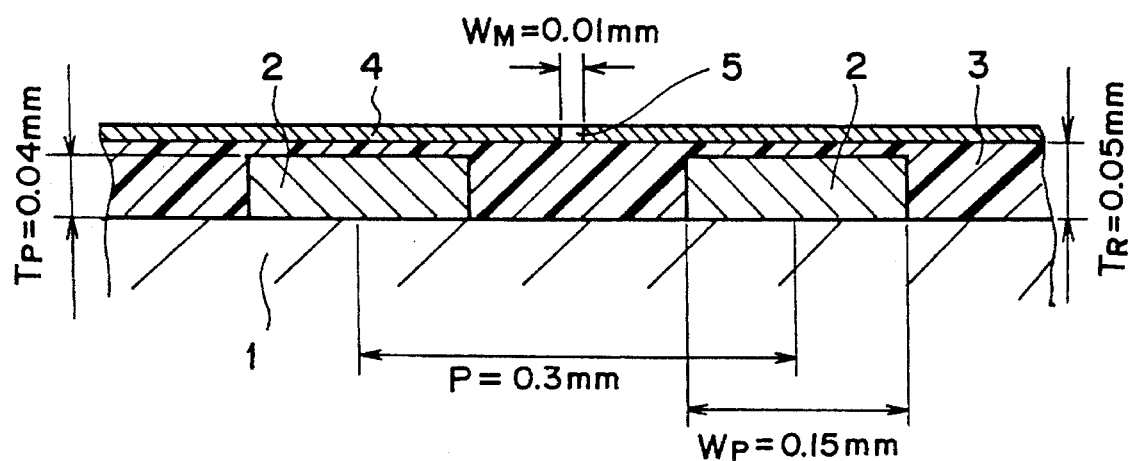
FIGS. 4A and 4B are sectional views of a part of the structure for explaining sequential steps of designing the printed circuit board according to the method of the first embodiment.
Figure 4B:
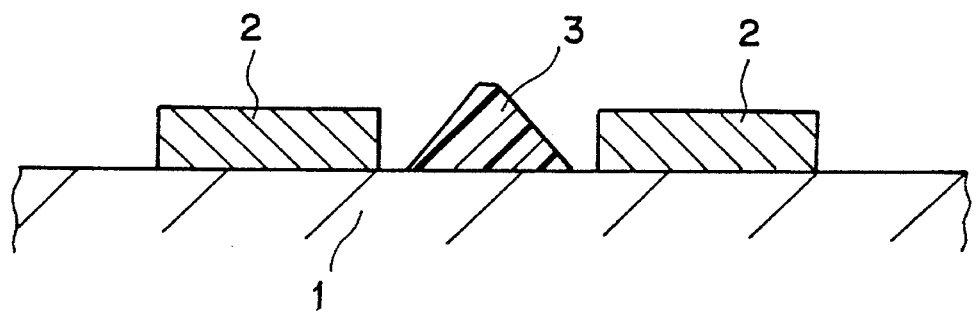
Figure 5:
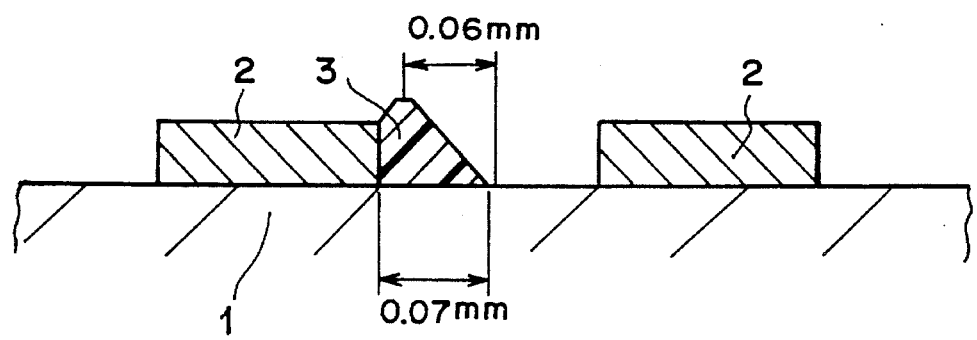
FIG. 5 is a sectional view of a part of the structure showing a state in which the mask film and the substrate are misaligned in the arrangement of FIGS. 4A and 4B.

FIGS. 4A and 4B show a structure in sectional views for explaining in sequential steps an example of designing the structure according to the method of the first embodiment of the invention. FIG. 5 shows in a sectional view a state in which an undesirable misalignment has developed between the mask film and the substrate in the example shown in FIGS. 4A and 4B. As shown in FIG. 4A, in this example, the value of the width $W_p$ of the pad 2 with a 0.3 mm pitch (P=0.3 mm) is designed to be 0.15 mm, the thickness $T_p$ of the conductive layer (pad) to be 0.04 mm, and the thickness $T_R$ of the applied solder resist 3 to be 0.05 mm. The mask film 4 prepared has the light transmission portion 5 with a width $W_M$ of 0.01 mm. The exposure is carried out by using the light source which sufficiently exposes the solder resist 3 with the light directed up to 45° from the vertical direction of the light transmission portion 5 and this is followed by the predetermined developing process. As a result, as shown in FIG. 4B, the trapezoid solder resist 3 is formed between the pads 2.

When the design is as explained above for the first embodiment of the invention, even in the case where, as is noted from FIG. 5, the misalignment between the mask film and the substrate is up to ±0.06 mm, there is no possibility for the solder resist 3 to cover an upper surface of the pad 2, so that the 0.07 mm line width of the solder resist can be secured on the substrate 1 resulting in the stable and satisfactory adhesion with respect to the substrate 1.

Figure 6A:
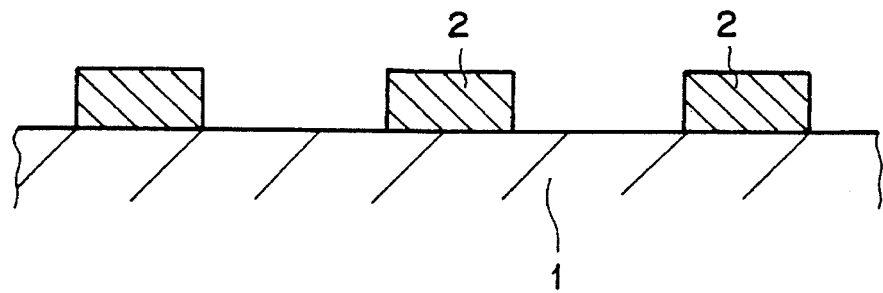
FIGS. 6A–6D are sectional views of a structure for explaining sequential process steps of a method of fabricating a printed circuit board of a second embodiment according to the invention.
Figure 6B:
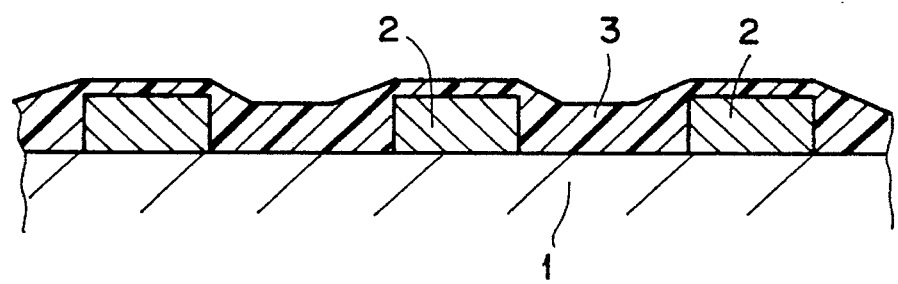
Figure 6C:
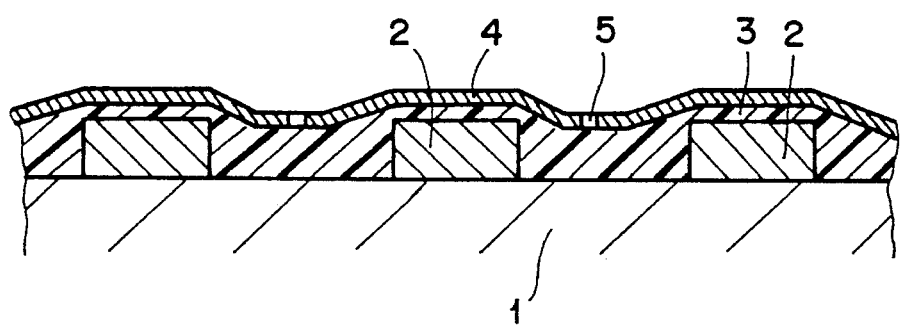
Figure 6D:
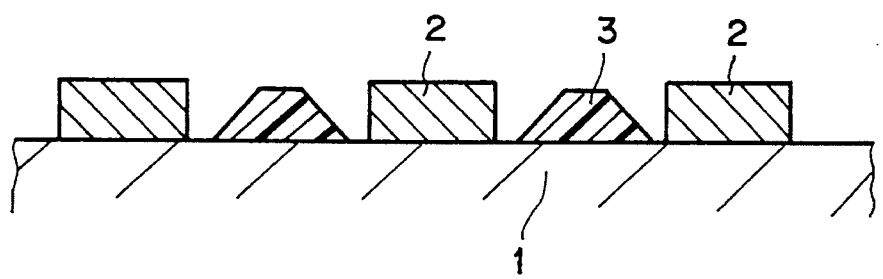

FIGS. 6A to 6D show a structure in sectional views for explaining sequential process steps of a method of a second embodiment according to the invention. First, as shown in FIG. 6A, a predetermined printed circuit (not shown) and pads 2 are formed on a substrate 1. Then, as shown in FIG. 6B, a solder resist 3 of an optical hardening type is applied on the substrate 1 and also the pads 2 by using a screen printing method. At that time, a viscosity of the solder resist is made to be not higher than 100 ps. By applying the solder resist using such viscosity, it is possible to suppress the solder resist 3 between the pads 2 to a lower thickness than the thickness of the pads 2. Next, as shown in FIG. 6C, a mask film 4 whose width of a light transmission portion 5 is narrower than the distance between the pads is placed on the solder resist 3 such that the light transmission portion 5 is positioned at a middle point between the pads 2 and then the exposure process is carried out on the optical hardening type solder resist 3 by using an exposure device having a light scattering type light source. For the scattered light to be efficiently used, it is preferable that the exposure device be configured such that the object to be exposed is stationary with the light source being adapted to scanning, or that the light source is stationary with the object being adapted to be scanned. Next, as shown in FIG. 6D, the developing is carried out whereby a trapezoid solder resist 3 whose thickness is thinner than the pads 2 is formed between the pads 2. The size of the light transmission portion 5 of the mask film 4 is determined by or dependent on the design values of the pads and the distance between the pads 2, the thickness of the solder resist 3 and the kind of light source employed.

Figure 7A:
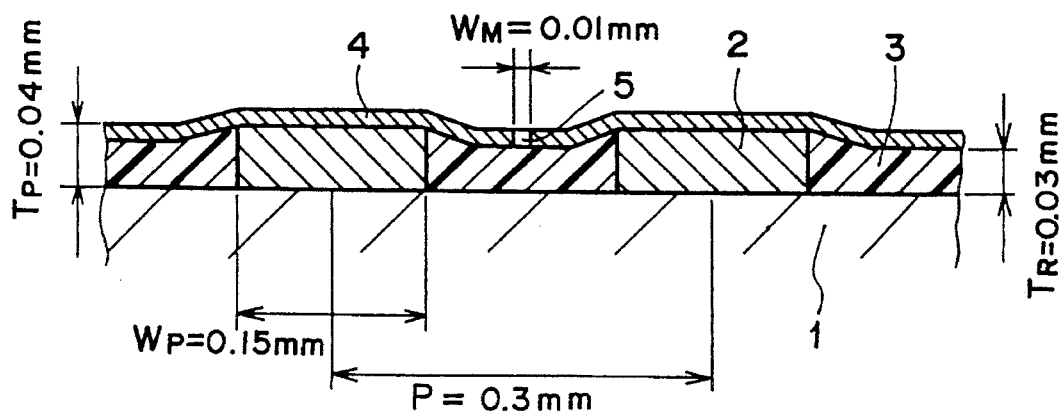
FIGS. 7A and 7B are sectional views of a part of the structure for explaining sequential steps of designing the printed circuit board according to the method of the second embodiment.
Figure 7B:
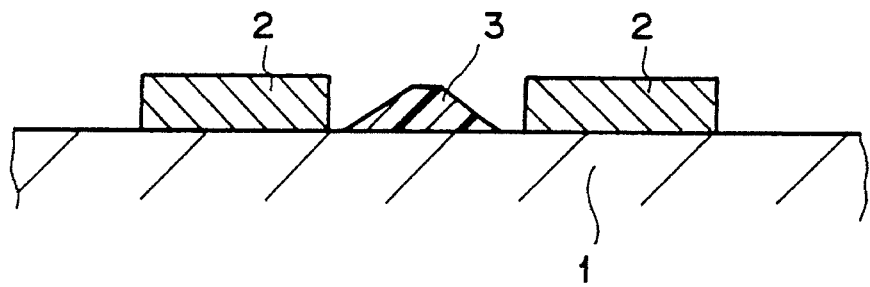
Figure 8:
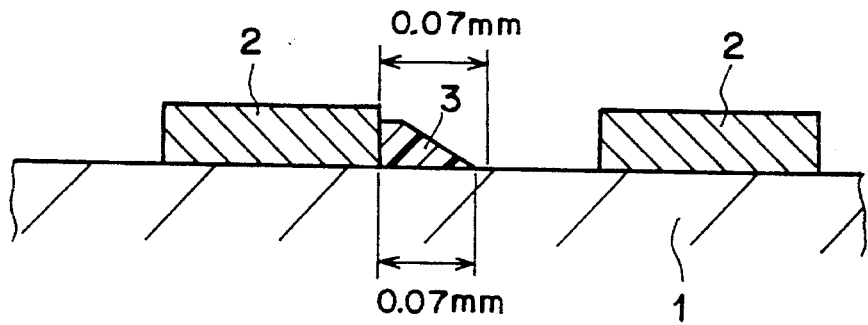
FIG. 8 is a sectional view of a part of the structure showing a state in which the mask film and the substrate are misaligned in the arrangement of FIGS. 7A and 7B.

FIGS. 7A and 7B show a structure in sectional views for explaining in sequential steps an example of designing the structure according to the method of the second embodiment of the invention. FIG. 8 shows in a sectional view a state in which an undesirable misalignment has developed between the mask film and the substrate in the example shown in FIGS. 7A and 7B. As shown in FIG. 7A, in this example, the value of the width Wp of the pad 2 with a 0.3 mm pitch (P=0.3 mm) is designed to be 0.15 mm, the thickness $T_p$ of the conductive layer (pad) to be 0.04 mm, and the thickness $T_R$ of the applied solder resist 3 to be 0.03 mm. The mask film 4 prepared has the light transmission portion 5 with a width $W_M$ of 0.01 mm. The exposure is carried out by using the light source which sufficiently exposes the solder resist 3 with the light directed up to 60° from the vertical direction of the light transmission portion 5 and this is followed by the predetermined developing process. As a result, as shown in FIG. 7B, the trapezoid solder resist 3 is formed between the pads 2.

When the design is as explained above for the second embodiment of the invention, even in the case where, as is noted from FIG. 8, the misalignment between the mask film and the substrate is up to ±0.07 mm, there is no possibility for the solder resist 3 to cover an upper surface of the pad 2, so that the 0.07 mm line width of the solder resist can be secured on the substrate 1 resulting in the stable and satisfactory adhesion with respect to the substrate 1.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method of fabricating a printed circuit board, comprising the steps of:

forming on a substrate a circuit pattern including pads;

applying a solder resist on said substrate and said circuit pattern; and exposing said solder resist between said pads using scattered light and a mask film which has light transmission portions.

2. The method of fabricating a printed circuit board according to claim 1, wherein said mask film is placed on said solder resist such that each of said light transmission portions is positioned at a middle point between said pads.

3. The method of fabricating a printed circuit board according to claim 1, wherein each of said light transmission portions has a width that is smaller than a distance between said pads.

4. The method of fabricating a printed circuit board according to claim 1, wherein said solder resist is applied on said substrate and said pads such that said solder resist between said pads is thicker than said pads and said solder resist is exposed with said scattered light directed up to 45° from a central longitudinal axis of said light transmission portions.

5. A method of fabricating a printed circuit board, comprising the steps of:

forming on a substrate a circuit pattern including pads;

applying a solder resist on said substrate and said circuit pattern; and exposing said solder resist between said pads using scattered light and a mask film which has light transmission portions, wherein said solder resist is applied on said substrate and said pads such that said solder resist between said pads is thinner than said pads and said solder resist is exposed with said scattered light directed up to 60° from a central longitudinal axis of said light transmission portions.

6. The method of fabricating a printed circuit board according to claim 1, wherein said exposing step forms a trapezoid solder resist between the pads.

7. The method of fabricating a printed circuit board according to claim 6, wherein each of said light transmission portions has a width that is less than a base of said trapezoid.

8. The method of fabricating a printed circuit board according to claim 5, wherein said exposing step forms a trapezoid solder resist between the pads.

9. The method of fabricating a printed circuit board according to claim 8, wherein each of said light transmission portions has a width that is less than a base of said trapezoid.

10. The method of fabricating a printed circuit board according to claim 5, wherein said solder resist has a viscosity less than or equal to 100 ps.

* * * * *